(12) United States Patent
Liaw

(10) Patent No.: US 7,675,124 B2
(45) Date of Patent: Mar. 9, 2010

(54) MEMORY ARRAY STRUCTURE WITH STRAPPING CELLS

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 64 days.

(21) Appl. No.: 11/361,248

(22) Filed: Feb. 24, 2006

(65) Prior Publication Data

US 2007/0200182 A1 Aug. 30, 2007

(51) Int. Cl.
*H01L 27/108* (2006.01)
*H01L 27/11* (2006.01)
*H01L 27/112* (2006.01)

(52) U.S. Cl. ............... 257/390; 257/903; 257/E27.099

(58) Field of Classification Search ................ 257/390, 257/903, E27.099; H01L 29/76
See application file for complete search history.

(56) References Cited

U.S. PATENT DOCUMENTS

| | | | | |
|---|---|---|---|---|
| 5,111,428 A | * | 5/1992 | Liang et al. | 365/104 |
| 5,467,305 A | * | 11/1995 | Bertin et al. | 365/185.08 |
| 5,710,448 A | * | 1/1998 | Krautschneider et al. | 257/288 |
| 5,831,315 A | * | 11/1998 | Kengeri et al. | 257/393 |
| 5,867,434 A | * | 2/1999 | Oh et al. | 365/200 |
| 6,285,088 B1 | * | 9/2001 | Madan | 257/202 |
| 6,731,534 B1 | * | 5/2004 | Fan | 365/154 |
| 6,744,106 B2 | * | 6/2004 | Kanai | 257/390 |
| 2003/0122160 A1 | * | 7/2003 | Houston et al. | 257/207 |
| 2004/0062101 A1 | * | 4/2004 | Kasuga | 365/200 |
| 2004/0238863 A1 | * | 12/2004 | Liu et al. | 257/296 |
| 2006/0202361 A1 | * | 9/2006 | Liaw | 257/903 |
| 2007/0076491 A1 | * | 4/2007 | Cherukuri | 365/189.01 |
| 2007/0235765 A1 | * | 10/2007 | Liaw | 257/207 |

* cited by examiner

*Primary Examiner*—Davienne Monbleau
*Assistant Examiner*—Christopher M Roland
(74) *Attorney, Agent, or Firm*—Slater & Matsil, L.L.P.

(57) ABSTRACT

A memory array with a row of strapping cells is provided. In accordance with embodiments of the present invention, strapping cells are positioned between two rows of a memory array. The strapping cells provide a P+ strap between N+ active areas of two memory cells in a column and provide an N+ strap between P+ active areas of two memory cells in a column of the memory array. The strapping cells provide an insulating structure between the two rows of the memory array and create a more uniform operation of the memory cells regardless of the positions of the memory cells within the memory array. In an embodiment, a dummy N-well may be formed along the outer edge of the memory array in a direction perpendicular to the row of strapping cells. Furthermore, transistors may be formed in the strapping cells to provide additional insulation between the strapped memory cells.

21 Claims, 11 Drawing Sheets

MEMORY ARRAY STRUCTURE WITH STRAPPING CELLS

TECHNICAL FIELD

The present invention relates generally to semiconductor devices and, more particularly, to a memory cell layout for integrated circuits.

BACKGROUND

Generally, memory chips comprise an array of memory cells interconnected by bit lines and word lines. The word lines and bit lines are used to read and write binary values to each of the memory cells, wherein each memory cell represents a bit of information. Because each memory cell represents a bit of information and may be connected to other circuitry, it is desirable that the electrical and operational characteristics of all memory cells be consistent.

The operational and electrical characteristics of memory cells, however, vary depending on where a memory cell is located within the layout of the memory array. For example, memory cells along the edge of the memory array may have different electrical and operational characteristics than memory cells located in the inner region of the memory array. One cause of this difference in the electrical and operational characteristics is the lithography process. Generally, a lithography process involves patterning a mask layer on an underlying layer, and then performing a process such as implanting or etching the underlying layer. The density of the structures during this lithography process, however, is different for the region containing the inner memory cell and the region of the edge memory cell. It has been found that this difference in density may affect some processes such as the etching rates and implantation concentration, thereby causing a difference in the electrical and operational characteristics between memory cells located near or along the edge (e.g., sparsely populated regions) and memory cells located in the inner regions of the memory array (e.g., densely populated regions).

Another cause is the well-proximity effect. Implant masks, such as a patterned photo-resist layer, are used during the formation of wells. During the implantation process, some of the ions may scatter out of the edge of the implant mask and implant in the surface of the silicon near the mask edge. The implanted ions near the mask edge may alter the threshold voltage of those devices formed in the well. Because the distances between a device and a neighboring well may vary, the performance and operational characteristics of memory cells in the inner region of the memory array may be different than memory cells along the edge of the memory array.

Yet another cause of the different operating characteristics between inner memory cells and edge memory cells is the stress that may be induced by shallow-trench isolations (STIs). STIs are typically formed by etching a trench in the substrate and filling the trench with a dielectric material, typically a high-density oxide. The STIs, however, may exert a tensile or compressive stress in the channel region of nearby transistors, thereby altering the operational and electrical characteristics such as the threshold voltage and on/off current levels of the nearby transistors. This difference is particularly noticeable with transistors in memory cells along the edge of the memory array.

Therefore, there is a need for a memory array such that the electrical and operational characteristics of semiconductor devices are more consistent throughout the chip.

SUMMARY OF THE INVENTION

These and other problems are generally reduced, solved or circumvented, and technical advantages are generally achieved, by embodiments of the present invention, which provides a memory cell layout for integrated circuits.

In an embodiment, strapping cells are provided between adjacent rows of memory cells. The strapping cells provide a strap between respective N-type active areas of the adjacent rows of memory cells and between respective P-type active areas of the adjacent rows of memory cells. Preferably, the straps have a conductivity type opposite the active regions that the strap is connected between. For example, a P-type strap is used to connect respective N-type active regions of the memory cells, and an N-type strap is used to connect respective P-type active regions of the memory cells.

In another embodiment, one or more conductive lines are used to electrically couple one or more of the straps together. The conductive lines may be electrically coupled to a voltage source, such as $V_{ss}$ or $V_{cc}$. Each conductive line may comprise a single conductive line spanning the width of the memory array or may be divided into two or more smaller conductive lines. In this latter embodiment, the smaller segments of conductive lines may be electrically coupled to different voltage sources. For example, some conductive lines may be electrically coupled to $V_{ss}$ while other conductive lines may be electrically coupled to $V_{cc}$.

In yet another embodiment, two or more conductive lines are formed parallel to each other such that the conductive lines form gate electrodes where the conductive lines intersect the straps, thereby forming strapping transistors in series. In this embodiment, greater isolation may be obtained by electrically coupling the gates of the electrodes to the node between the transistors.

In yet another embodiment, a dummy well is formed along the edge of the memory array. For example, a typical memory array has a P-well on either side of the memory array, typically extending parallel to the word line. In this example, a dummy N-well is formed on one or both sides of the memory array adjacent the P-wells.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. In particular, the method of the present invention is described in the context of a 6T-RAM. One of ordinary skill in the art, however, will appreciate that features of the present invention described herein may be used for forming other types of devices, such as an 8T-SRAM memory device, memory devices other than SRAMs, or semiconductor devices other than memory devices. Furthermore, embodiments of the present invention may be used as stand-alone memory devices, memory devices integrated with other integrated circuitry, or the like. Accordingly, the specific embodiments discussed herein are merely illustrative of specific ways to make and use the invention, and do not limit the scope of the invention.

Figure 1:
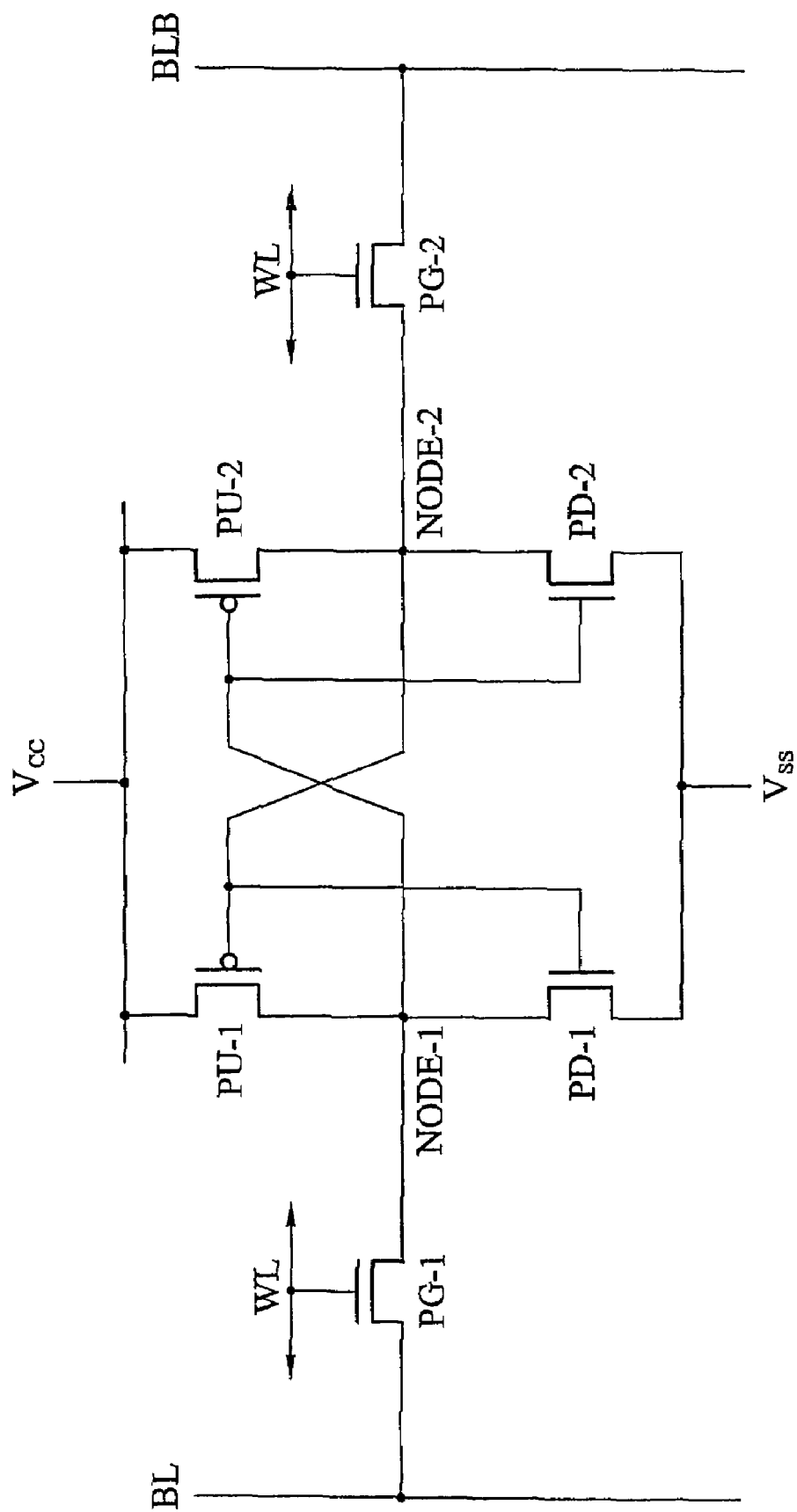
FIG. 1 is a schematic diagram of a typical 6T-RAM.

Referring first to FIG. 1, a schematic diagram of a 6T-RAM cell is shown for reference. Generally, the 6T-RAM cell comprises a first pass-gate transistor PG-1, a second pass-gate transistor PG-2, a first pull-up transistor PU-1, a second pull-up transistor PU-2, a first pull-down transistor PD-1, and a second pull-down transistor PD-2.

In operation, the memory cell forms two complementary nodes, node-1 and node-2. Because node-1 is tied to the gate of the second pull-up transistor PU-2 and node-2 is tied to the gate of the first pull-up transistor PU-1, the values stored in each node will remain complementary to each other. For example, when node-1 is high, the PMOS second pull-up transistor PU-2 prevents the current from the current source $V_{cc}$ from flowing to node-2. In parallel, the gate of the NMOS second pull-down transistor PD-2 is activated, allowing any charge that may be in node-2 to go to ground. Furthermore, when node-2 is low, the PMOS first pull-up transistor PU-1 allows current to flow from $V_{cc}$ to node-1, and the gate of the NMOS first pull-down transistor PD-1 is de-activated, preventing the charge in node-1 from going to ground. The gates of the first pass-gate transistor PG-1 and the second pass-gate transistor PG-2 are electrically coupled to a word line (WL) to control reading data from and writing data to the memory cell. Values stored in node-1 and node-2 are read on a bit-line (BL) and a complementary-BL, respectively, which are electrically coupled to a sense amplifier (not shown).

Figure 2:
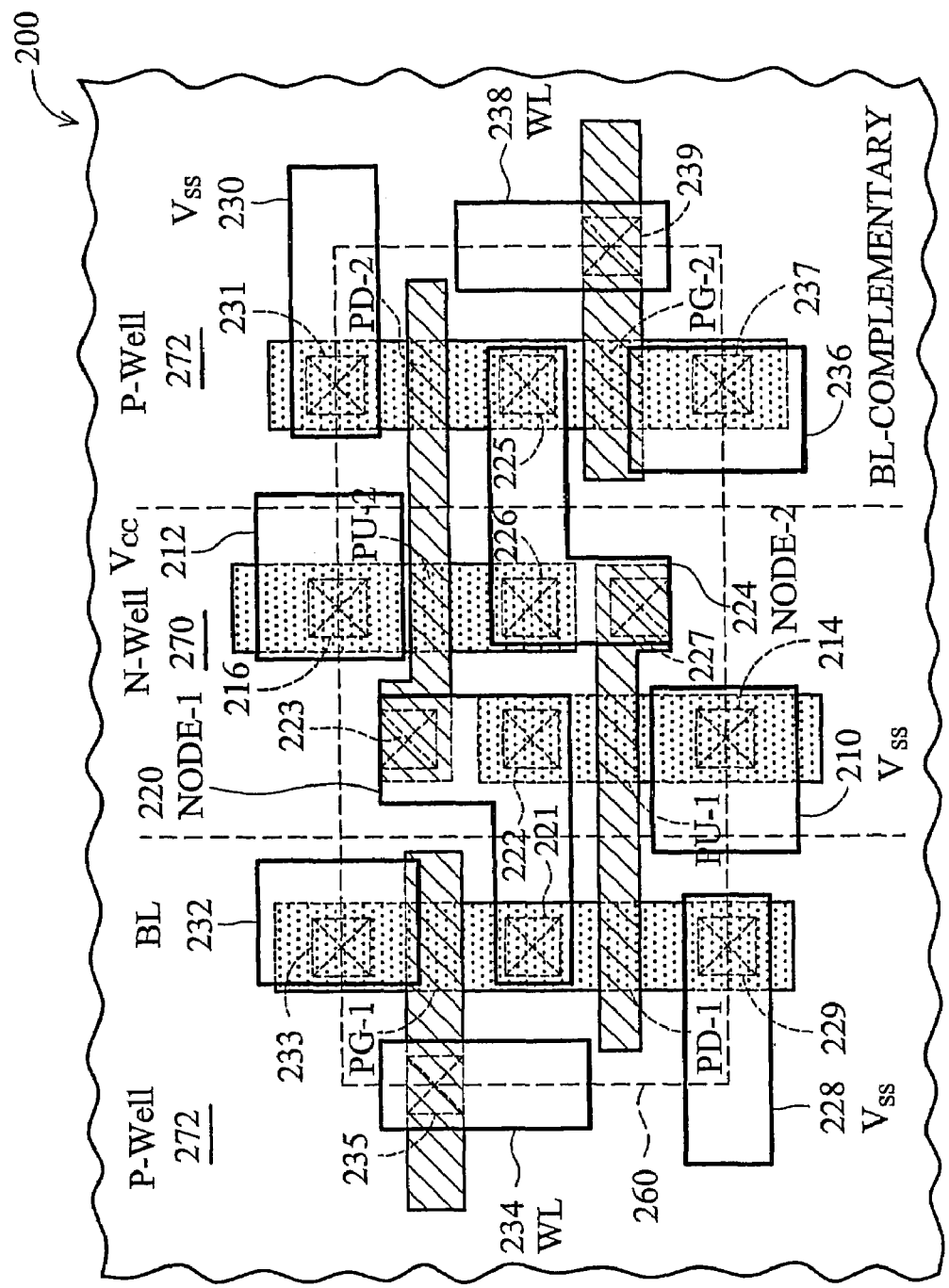
FIG. 2 is a plan view of transistor formation and the first metal layer of a 6T-SRAM in accordance with one embodiment of the present invention.

FIG. 2 is a plan view of the layout of a memory cell layout 200 of the 6T-SRAM cell illustrated in FIG. 1 in accordance with an embodiment of the present invention. The memory cell layout 200 comprises a first pass-gate transistor PG-1, a second pass-gate transistor PG-2, a first pull-down transistor PD-1, and a second pull-down transistor PD-2 formed in a P-well 272, and a first pull-up transistor PU-1 and a second pull-up transistor PU-2 formed in an N-well 270. For illustrative purposes, thick-lined rectangles with no fill indicate contact lines formed on the first metal layer.

Preferably, the first pull-up transistor PU-1 and the second pull-up transistor PU-2 are PMOS transistors formed in the N-well 270, and the other transistors are NMOS transistors formed in the P-well 272. The sources of the first pull-up transistor PU-1 and the second pull-up transistor PU-2 are electrically coupled to voltage source $V_{cc}$ contact lines 210 and 212, respectively, located on the first metal layer, via plugs 214 and 216.

The drain of the first pull-up transistor PU-1, the drain of the first pull-down transistor PD-1, the drain of the first pass-gate transistor PG-1, and the gates of the second pull-up transistor PU-2 and the second pull-down transistor PD-2 are electrically coupled via an intra-cell connection 220 located on the first metal layer and plugs 221, 222, and 223. Similarly, the drain of the second pull-up transistor PU-2, the drain of the second pull-down transistor PD-2, the drain of the second pass-gate transistor PG-2, and the gates of the first pull-up transistor PU-1 and the first pull-down transistor PD-1 are electrically coupled via an intra-cell connection 224 located on the first metal layer and plugs 225, 226, and 227.

The source of the first pull-down transistor PD-1 is electrically coupled to ground $V_{ss}$ via $V_{ss}$ contact line 228 and plug 229; and the source of the second pull-down transistor PD-2 is electrically coupled to ground $V_{ss}$ via $V_{ss}$ contact line 230 and plug 231.

The source of the first pass-gate transistor PG-1 is electrically coupled to the BL via a BL contact line 232 and plug 233. The first pass-gate transistor PG-1 electrically couples the BL to the drain of the first pull-up transistor PU-1 and the drain of the first pull-down transistor PD-1. The gate of the first pass-gate transistor PG-1 is electrically coupled to the WL via a WL contact line 234 on the first metal layer and plug 235.

The source of the second pass-gate transistor PG-2 is electrically coupled to the complementary-BL via a complementary-BL contact line 236 and plug 237. Similarly, the second pass-gate transistor PG-2 electrically couples the complementary-BL contact line 236 to the drain of the second pull-up transistor PU-2 and the drain of the second pull-down transistor PD-2. The gate of the second pass-gate transistor PG-2 is electrically coupled to the WL via a WL contact line 238 on the first metal layer and plug 239. One of ordinary skill in the art will appreciate that the above structure defines a unit or memory cell 260, as illustrated by the dotted line. The unit cell 260 defines the basic building block for designing memory cells and may be duplicated to create larger memories.

Figure 3A:
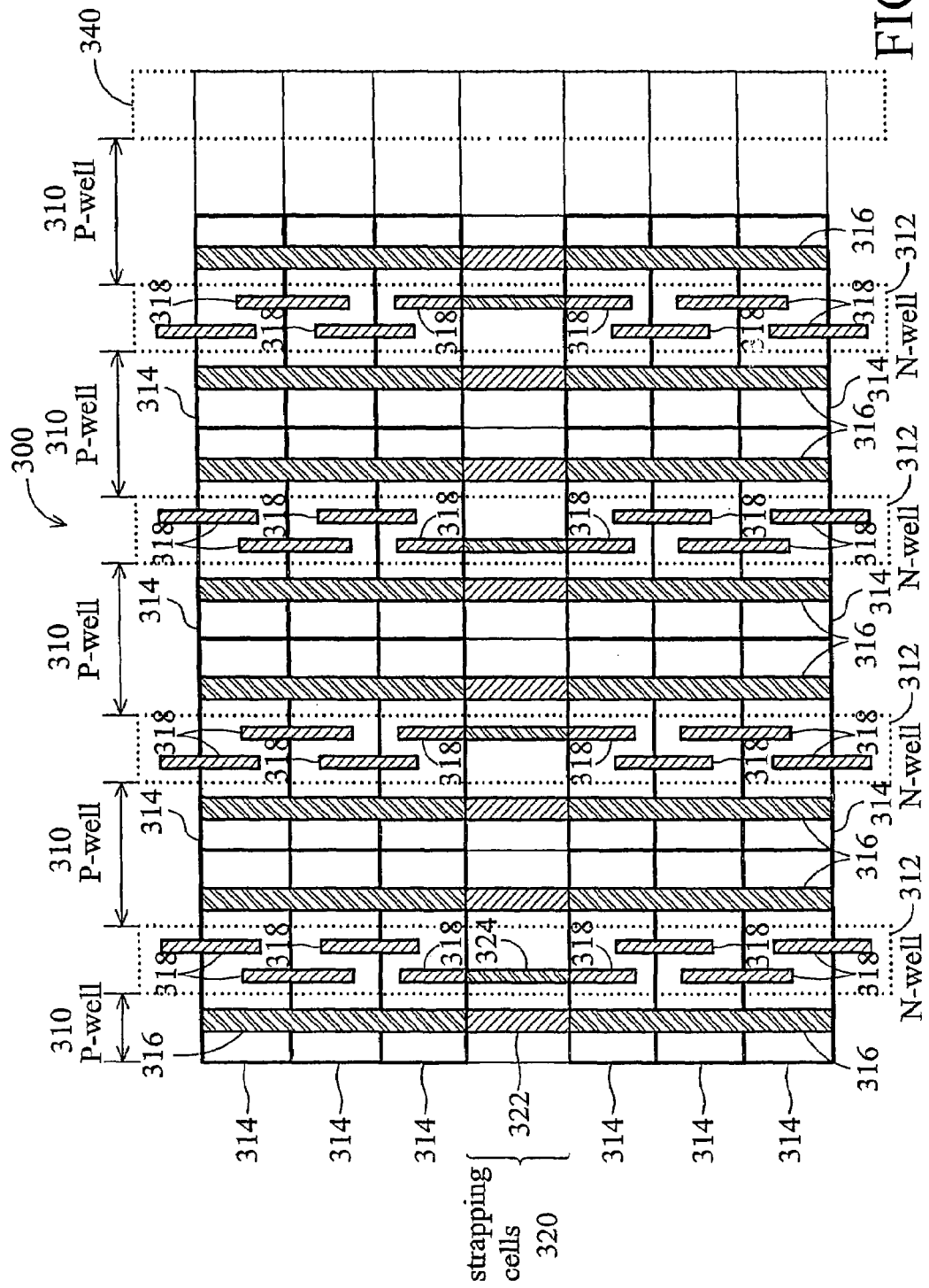
FIG. 3a is a plan view of a memory array having a row of strapping cells in accordance with an embodiment of the present invention.

FIG. 3a is a plan view of a portion of a memory cell array 300 in accordance with an embodiment of the present invention. In this embodiment, the memory cell array 300 comprises memory cells 314, each of which is illustrated in FIG. 3a as a rectangle with heavy lines. Each of the memory cells 314 is a storage unit such as the memory cell 200 illustrated in FIG. 2. It should be noted that the polysilicon, plugs, and metal layers of FIG. 2 have been omitted from FIG. 3a to better illustrate the features of the present invention.

Referring back to FIG. 3a, the memory cell array 300 has P-wells 310 and N-wells 312, wherein the N-wells 312 are indicated as an area enclosed by a dotted line and the P-wells 310 are the regions between two adjacent N-wells 312. The P-wells 310 have N-type active regions 316 formed therein that are $N^+$ doped and act as the source/drain regions of NMOS transistors formed in the memory cells 314. The N-type active regions 316 are shown as vertical rectangular regions having a bolded forward slash ("/") pattern. The N-wells 312 have P-type active regions 318 formed therein that are $P^+$ doped and act as the source/drain regions of PMOS transistors formed in the memory cells 314. The P-type active regions 318 are shown as vertical rectangular regions having a light backslash ("\") pattern.

A row of strapping cells 320 are positioned between two rows of the memory cells 314. Each of the strapping cells 320 comprises a $P^+$ strap 322 interconnecting the $N^+$ active regions 316 of adjacent rows of memory cells 314 and an $N^+$ strap 324 interconnecting the $P^+$ active regions 318 of adjacent rows of memory cells 314.

As illustrated in FIG. 3a, the $P^+$ strap 322 substantially abuts respective $N^+$ active regions 316 in the memory cells above and below the strapping cells 320. In this manner, the $N^+$ active regions 316 are sufficiently isolated without the need of forming an isolation structure (e.g., STIs), thereby reducing and/or preventing stress that may be induced in the $N^+$ active regions 316 by adjacent isolation structures. Likewise, the $N^+$ strap 324 substantially abuts respective $P^+$ active regions 318 in memory cells above and below the strapping cells 320, thereby isolating the $P^+$ active regions 318 without the need of forming an isolation structure (e.g., STIs) and reducing and/or preventing stress that may be induced in the $P^+$ active regions 318 by adjacent isolation structures.

In an embodiment, the $P^+$ straps 322 and $N^+$ straps 324 may be fabricated during the same steps as the $P^+$ active regions 318 and the $N^+$ active regions 316, respectively.

A well contact (not shown) may be provided to form an electrical connection to the $P^+$ straps 322 and $N^+$ straps 324, providing a well bias or a source bias to the well regions of the transistors.

Also illustrated on FIG. 3a is an optional dummy N-well 340 running substantially parallel to the P-well 310 on an edge of the memory array 300. FIG. 3a only illustrates one dummy N-well 340 for illustrative purposes only. Additional dummy N-wells, such as a dummy N-well on an opposing side of the memory array 300, may be used in addition to or in place of the dummy N-well 340 illustrated in FIG. 3a. In an embodiment, the dummy N-well 340 is electrically coupled to $V_{cc}$, or another predetermined voltage, or is floating.

It has been found that the dummy N-well may improve well isolation margin and balance the well proximity effect. In this manner, the electrical and operational characteristics of the memory cells along the edge of the memory array will more closely match the electrical and operational characteristics of inner memory cells.

Figure 3B:
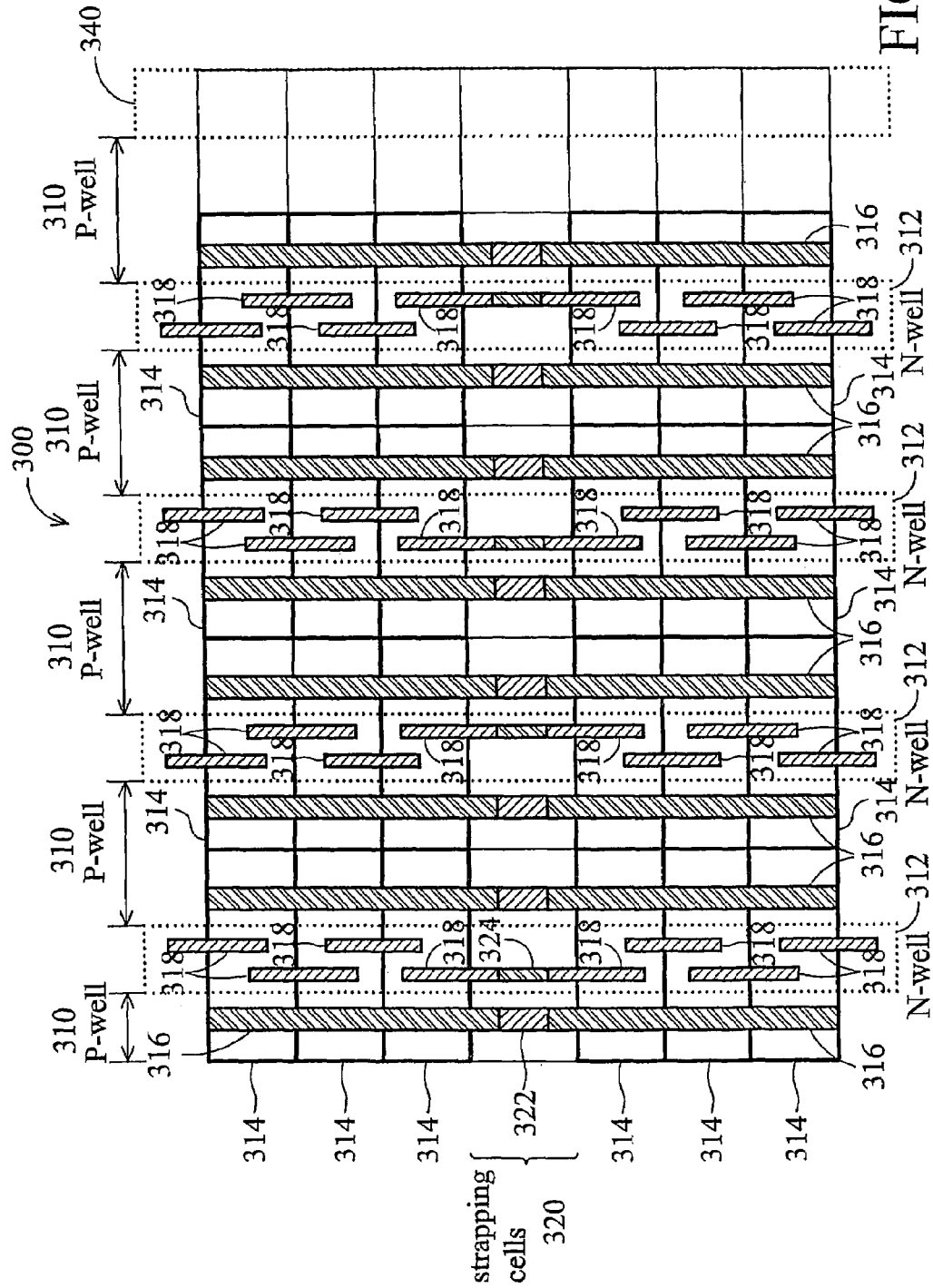
FIG. 3b is a plan view of a memory array having a row of strapping cells in accordance with another embodiment of the present invention.

FIG. 3b illustrates another embodiment of the present invention. The embodiment illustrated in FIG. 3b is similar to FIG. 3a, wherein like reference numerals refer to like elements, except that the N-type active regions 316 and the P-type active regions 318 extend into the strapping cells 320. In this manner, the junctions between the N-type active regions 316 and the $P^+$ straps 322 are positioned within the strapping cells 320. Similarly, the junctions between the P-type active regions 318 and the $N^+$ straps 324 are positioned within the strapping cells 320, as well.

Figure 3C:
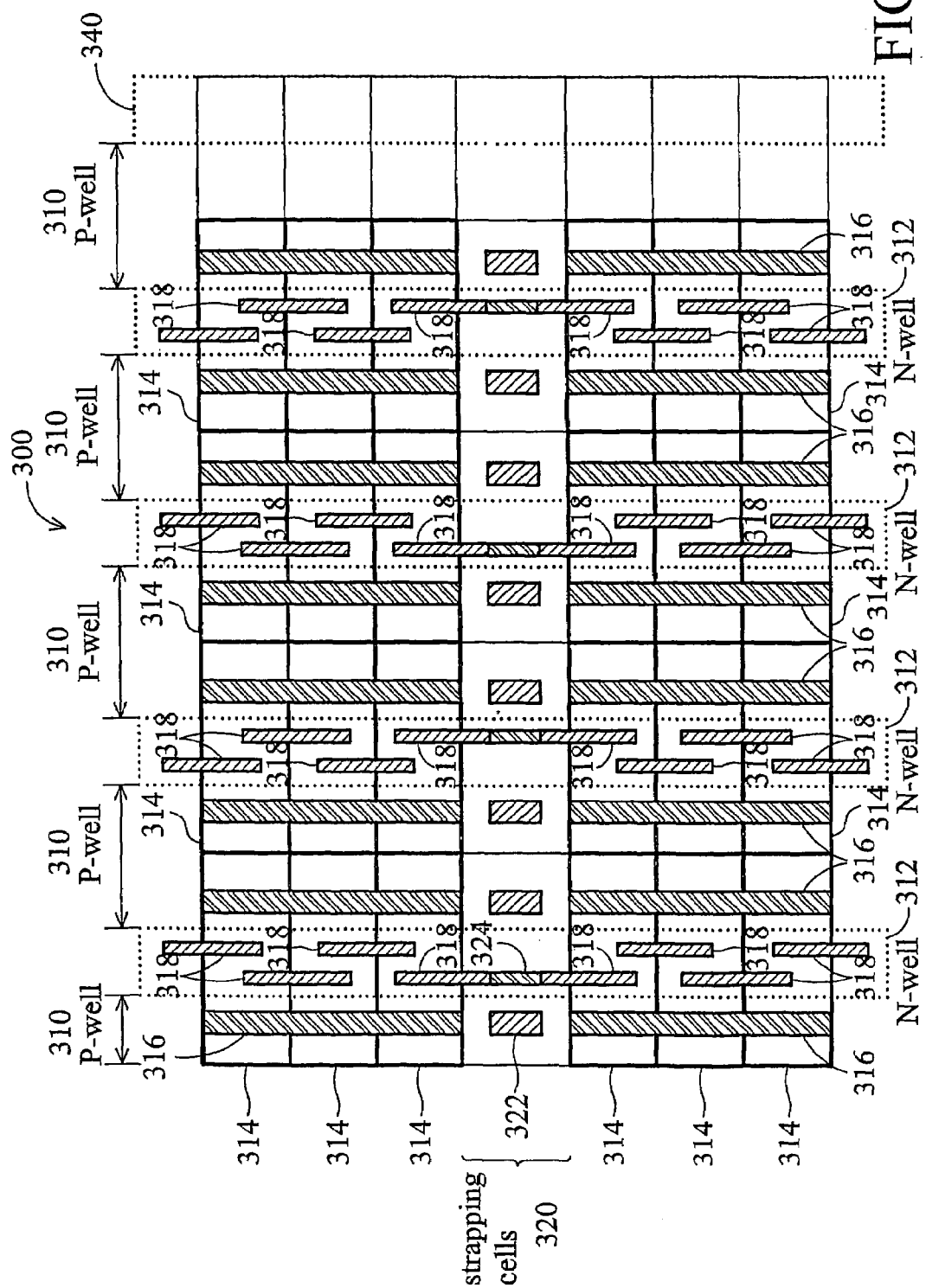
FIG. 3c is a plan view of a memory array having a row of strapping cells in accordance with yet another embodiment of the present invention.

FIG. 3c illustrates yet another embodiment of the present invention. FIG. 3c is similar to FIG. 3b, wherein like reference numerals refer to like elements, except that the N-type active regions 316 and the $P^+$ straps 322 do not immediately abut each other. Rather, the N-type active regions 316 stop approximately at the end of the strapping cells 320 and a gap of about 400 Å to about 4000 Å exists between the N-type active regions 316 and the $P^+$ straps 322. Other configurations may be used in accordance with embodiments of the present invention.

Figure 4:
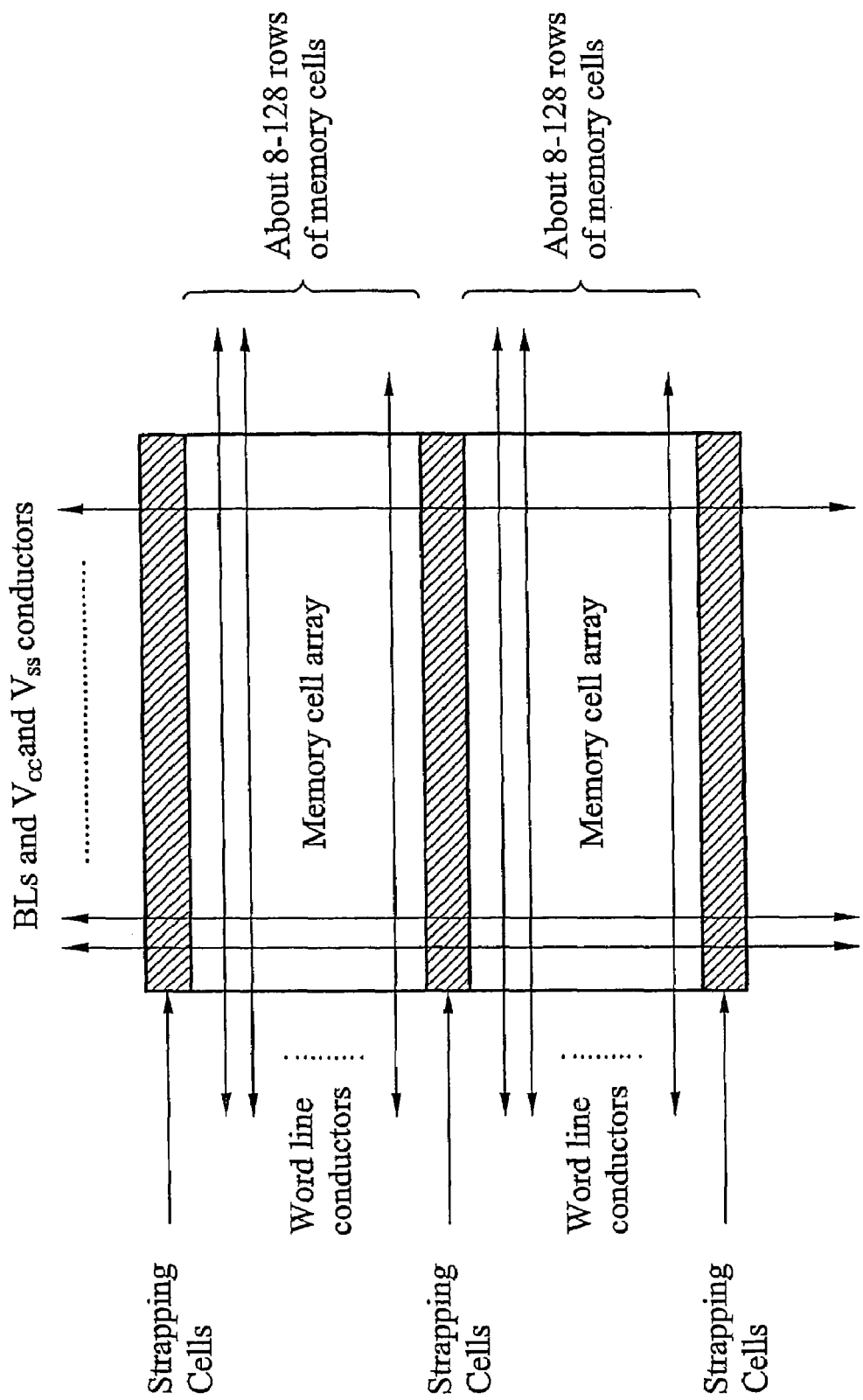
FIG. 4 is a schematic diagram of a memory array illustrating placement of a row of strapping cells in accordance with an embodiment of the present invention.

FIG. 4 illustrates the arrangement of a memory array in accordance with an embodiment of the present invention. A row of strapping cells is positioned periodically between two adjacent rows of the memory cell array. In a preferred embodiment, a row of strapping cells are positioned about every 4 to about 1024 rows of memory cells and is repeated in this fashion as required by the size of the memory cell array.

Also shown in FIG. 4 is the arrangement of the bit lines (BL and BL-Complementary), voltage source conductors (e.g., $V_{cc}$ and $V_{ss}$ lines), and word lines in an embodiment of the present invention. In this embodiment, the word lines are parallel to the row of strapping cells and the bit lines and voltage source conductors are perpendicular to the row of strapping cells. Each word line is electrically coupled to a row of memory cells. It should be noted that the bit lines, voltage source conductors, and word lines are preferably formed on one or more of the overlying metal layers, and that different layouts may be used.

Figure 5:
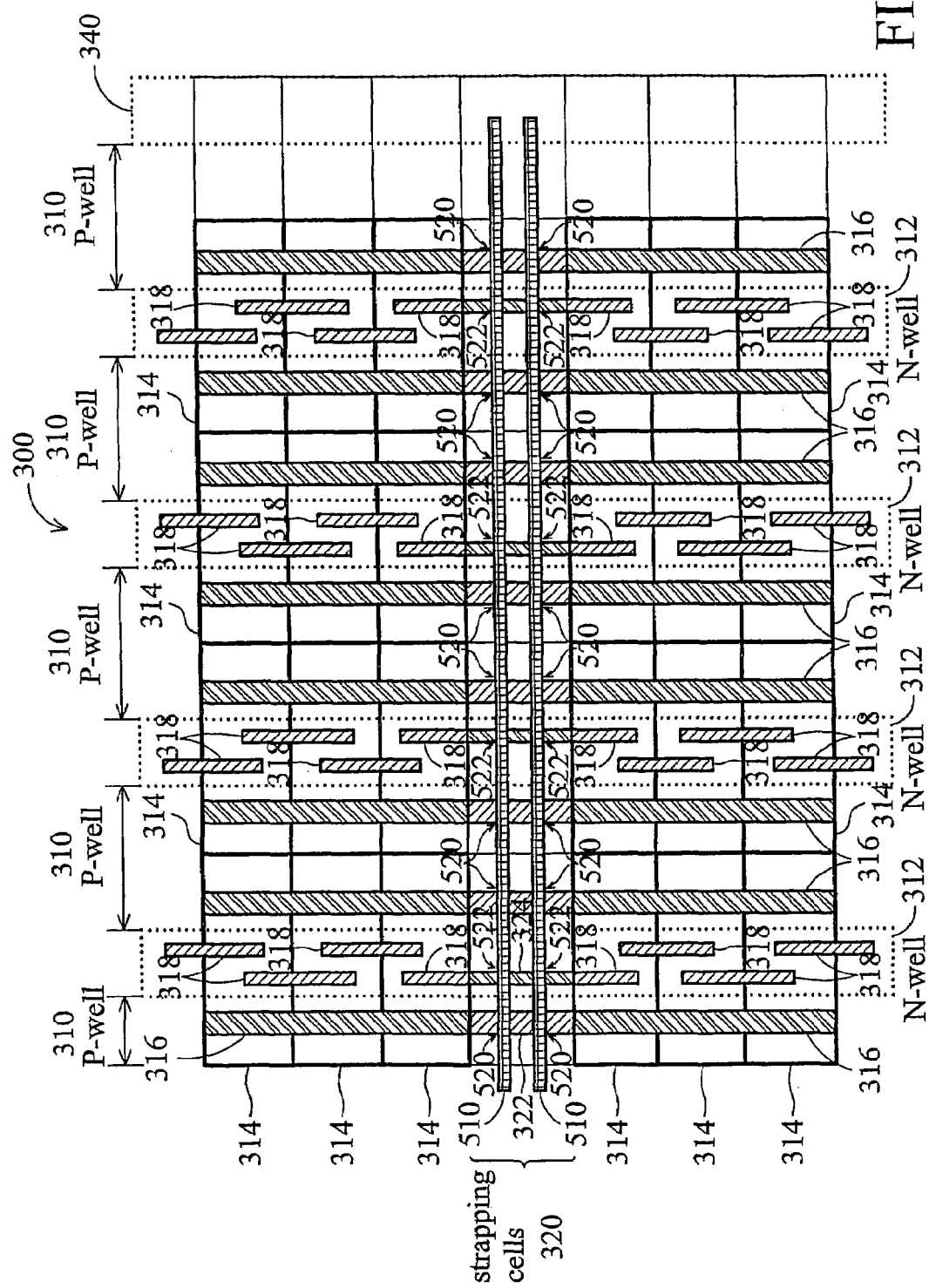
FIG. 5 is a plan view of a memory array having a row of strapping cells with conductive lines electrically coupling a plurality of straps in accordance with an embodiment of the present invention.

FIG. 5 is a plan view of the portion of the memory cell array 300 illustrated in FIG. 3b with one or more optional dummy strapping lines 510. In an embodiment, the dummy strapping lines 510 formed over the $P^+$ straps 322 and $N^+$ straps 324 form gate electrodes of PMOS strapping transistors 520 and NMOS strapping transistors 522, respectively, and may be formed during the same processing steps used to form gate electrodes (not shown) for transistors (not shown) of the memory cell (see FIGS. 1 and 2). In this embodiment, it is preferred that the gate of the strapping transistors 520 and 522 be tied to the node positioned between two sequential strapping transistors. It should be noted that two dummy strapping lines 510 are shown for illustrative purposes only and that fewer or more dummy strapping lines may be used.

Figure 6:
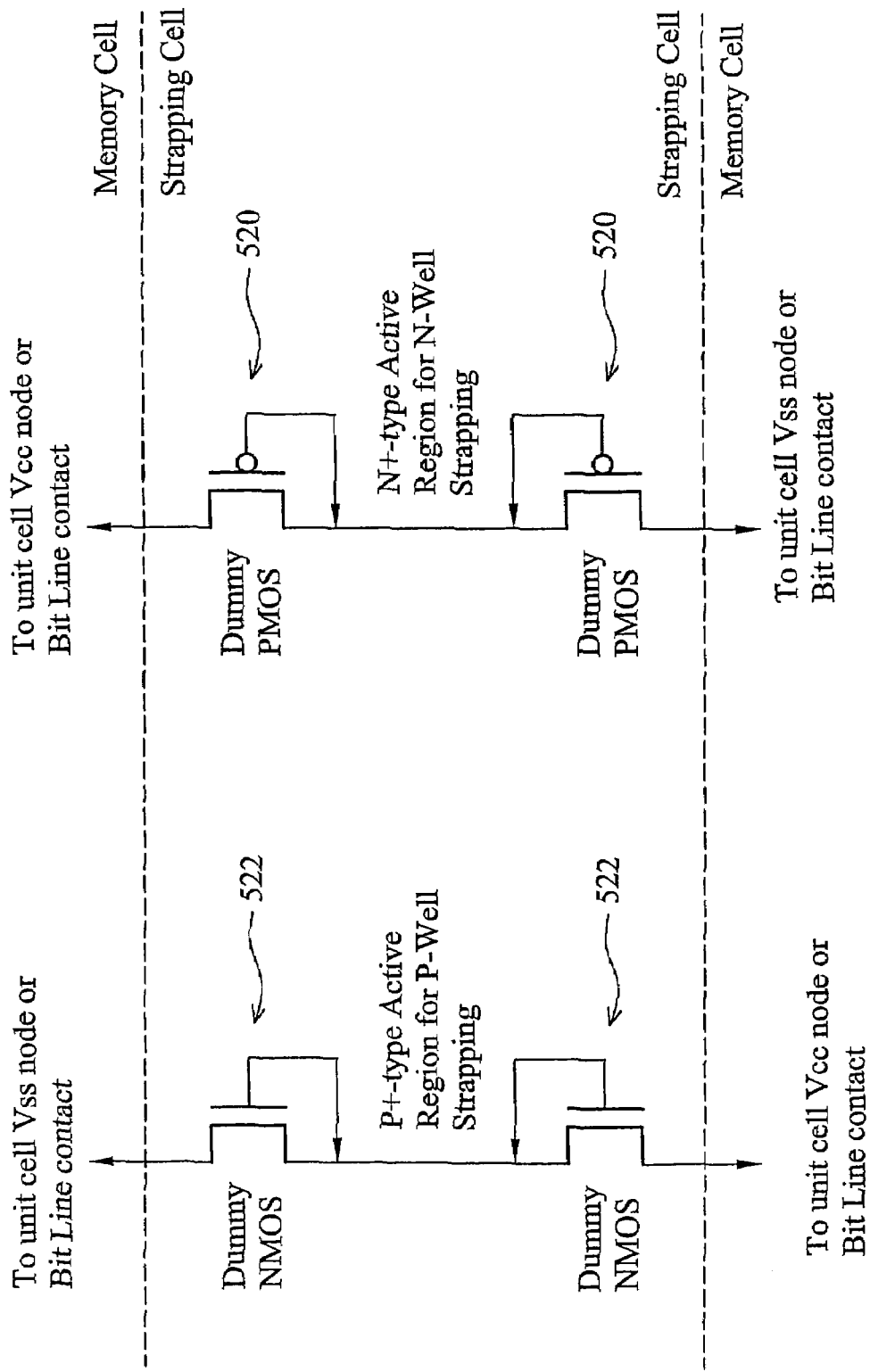
FIG. 6 is a schematic diagram of transistors formed in series in the strapping cells in accordance with an embodiment of the present invention.

FIG. 6 is a circuit diagram illustrating strapping transistors 520 and 522 in this type of embodiment. In particular, FIG. 6 illustrates the gates of the dummy NMOS transistors being tied to the node positioned between the dummy NMOS transistors, and the gates of the dummy PMOS transistors being tied to the node positioned between the dummy PMOS transistors. This type of design can support well bias or source bias as required by specific design requirements.

Figure 7:
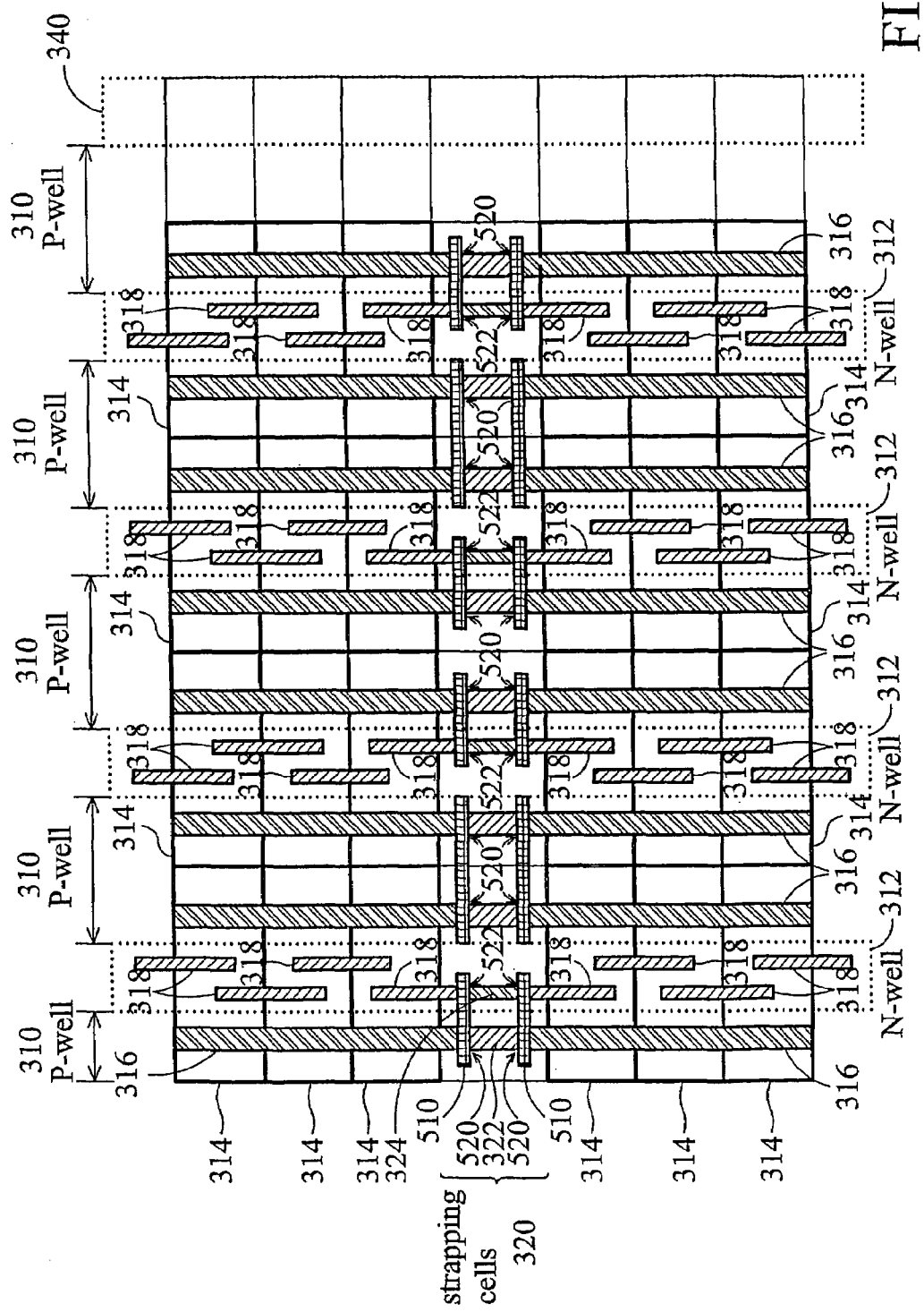
FIG. 7 is a plan view of a memory array having a row of strapping cells with conductive lines electrically coupling a plurality of straps in accordance with another embodiment of the present invention.

FIG. 7 is another embodiment that illustrates an alternative configuration for the dummy strapping lines 510 of FIG. 5. As illustrated in FIG. 7, in this embodiment the dummy strapping lines 510 have been separated to allow different biases to be applied to the various dummy transistors. One skilled in the art will appreciate that other configurations may be used.

Figure 8:
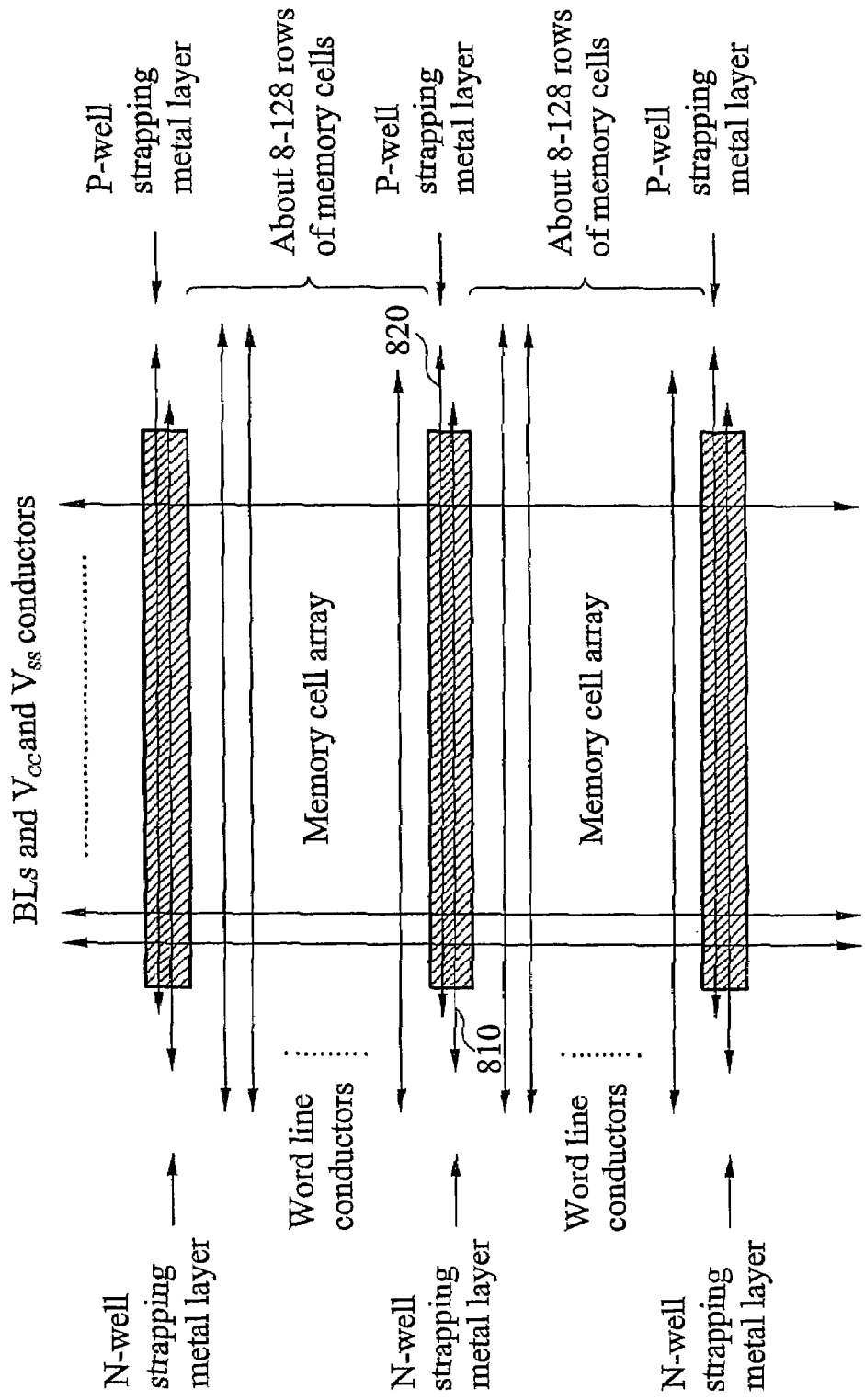
FIG. 8 is a schematic diagram of a memory array illustrating placement of a row of strapping cells and conductive lines in accordance with another embodiment of the present invention.

FIG. 8 illustrates another arrangement of a memory array in accordance with an embodiment of the present invention wherein dummy strapping lines (such as the dummy strapping lines 510 of FIGS. 5 and 7) are utilized. This embodiment is similar to that embodiment discussed above with reference to FIG. 4, except that an N-well strapping metal layer 810 and a P-well strapping metal layer 820 have been added overlying the row of strapping cells. The N-well strapping layer 810 and P-well strapping layer 820 provide electrical connections to the gate and the node between the strapping transistors.

Figure 9:
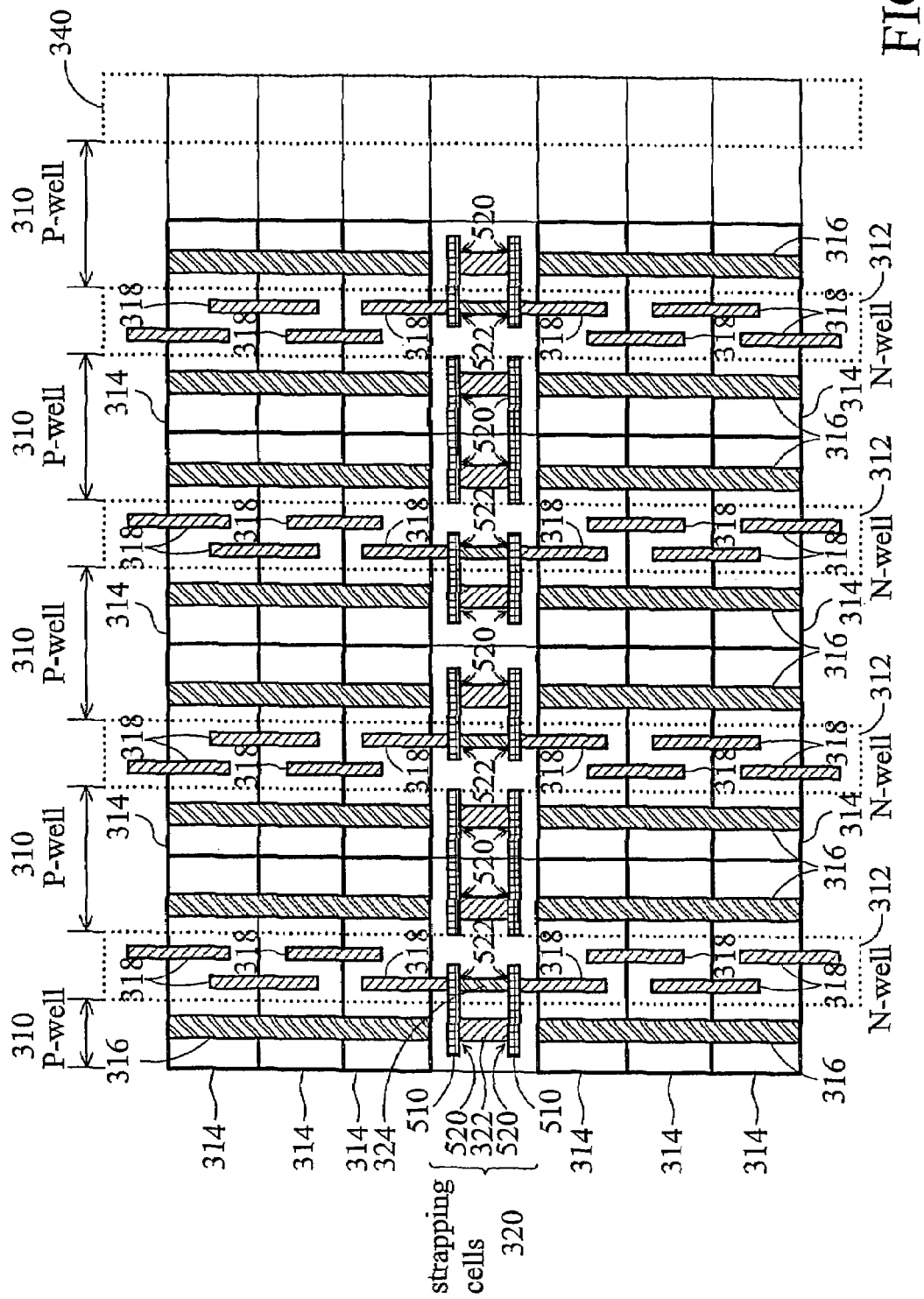
FIG. 9 is a is a plan view of a memory array having a row of strapping cells with conductive lines electrically coupling a plurality of straps in accordance with yet another embodiment of the present invention.

FIG. 9 illustrates yet another arrangement of a memory array in accordance with an embodiment of the present invention wherein dummy strapping lines are utilized. This embodiment is similar to the memory array illustrated in FIG. 7, wherein like reference numerals refer to like elements. It should be noted that the strapping cells have a configuration similar to that illustrated in FIG. 3c. In particular, the N-type active regions 316 stop approximately at the edge of the strapping cells 320, forming a gap between the N-type active regions 316 and the P+ straps 322.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device comprising:
   a first memory cell and a second memory cell, each memory cell having at least two N-type active areas and a P-type active area interposed between the N-type active areas; and
   a strapping cell between the first memory cell and the second memory cell, wherein the strapping cell has at least two P-type straps and at least one N-type strap, one of the P-type straps connecting one of the N-type active areas of the first memory cell to one of N-type active areas of the second memory cell, another one of the P-type straps connecting another one of the N-type active areas of the first memory cell to another one of the N-type active areas of the second memory cell, and the N-type strap connecting the respective P-type active areas of the first memory cell and the second memory cell.

2. A memory device comprising:
   a first row of memory cells;
   a second row of memory cells;
   a row of strapping cells substantially parallel to a word line, wherein each strapping cell has a first strap of a first conductivity type that substantially abuts active regions of a second conductivity type in respective memory cells of the first row and the second row; and
   dummy gate layers overlying the first strap, thereby forming dummy transistors in one or more of the strapping cells;
   wherein the first strap is in a first well having the first conductivity type, the first strap extending to a border of the first well.

3. The memory device of claim 2, wherein a drain node of the dummy transistors is electrically coupled to $V_{ss}$ or a memory cell bit line, wherein a source node and a gate of the dummy transistors are electrically coupled to a P-well strapping layer, the P-well strapping layer being electrically coupled to $V_{ss}$.

4. The memory device of claim 2, wherein a drain node of the dummy transistors is electrically coupled to $V_{ss}$ or a memory cell bit line, wherein a source node and a gate of the dummy transistors are electrically coupled to a P-well strapping layer, the P-well strapping layer being electrically coupled to a bias voltage.

5. The memory device of claim 2, wherein a drain node of the dummy transistors is electrically coupled to $V_{cc}$ wherein a source node and a gate of the dummy transistors are electrically coupled to an N-well strapping layer, the N-well strapping layer being electrically coupled to $V_{cc}$.

6. The memory device of claim 2, wherein a drain node of the dummy transistors is electrically coupled to $V_{cc}$, wherein a source node and a gate of the dummy transistors are electrically coupled to an N-well strapping layer, the N-well strapping layer being electrically coupled to a voltage source different than $V_{cc}$.

7. The memory device of claim 2, wherein each strapping cell further comprises a second strap of the first conductivity type electrically connecting second active areas of the second conductivity type in adjacent memory cells.

8. The memory device of claim 7, further comprising one or more dummy conductive lines electrically coupling a plurality of the first straps, a plurality of the second straps, or one or more of the first straps and second straps.

9. The memory device of claim 7, further comprising at least two sequential transistors formed in each of the first straps and second straps.

10. The memory device of claim 9, wherein gates of the transistors are electrically coupled to a node between the transistors.

11. The memory device of claim 2, further comprising a dummy N-well formed adjacent a well along an edge of the first and second row of memory cells.

12. The memory device of claim 2, wherein the first well is electrically coupled to $V_{cc}$, a predetermined voltage, or floating.

13. The memory device of claim 2, wherein the memory device is an SRAM.

14. A memory device comprising:
   a first row of memory cells electrically coupled to a first word line;
   a second row of memory cells electrically coupled to a second word line; and
   a row of strapping cells, wherein each strapping cell has a first region of an N-type conductivity that substantially abuts active regions of a P-type conductivity in respective memory cells of the first row and the second row, the first region being located in an N-well and extending to a border of the N-well.

15. The memory device of claim 14, wherein each strapping cell further comprises a second region of the P-type conductivity and that substantially abuts active regions of the N-type conductivity in respective memory cells of the first row and the second row.

16. The memory device of claim 15, further comprising one or more dummy conductive lines electrically coupling a plurality of the first regions, a plurality of the second regions, or one or more of the first regions and second regions.

17. The memory device of claim 15, further comprising at least two sequential transistors formed in each first region and second region.

18. The memory device of claim 17, wherein gates of the transistors are electrically coupled to a node between the transistors.

19. The memory device of claim 14, further comprising a dummy well formed adjacent a well along an edge of an array of memory cells.

20. The memory device of claim 19, wherein the dummy well is a dummy N-well that is electrically coupled to $V_{cc}$.

21. The memory device of claim 19, wherein the dummy well is a dummy N-well that is electrically floating.

* * * * *